United States Patent
Kim

(10) Patent No.: US 7,387,854 B2
(45) Date of Patent: Jun. 17, 2008

(54) METHOD OF FORMING AN ISOLATED LINE PATTERN USING PHOTOLITHOGRAPHY

(75) Inventor: Hong Lae Kim, Icheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 495 days.

(21) Appl. No.: 11/026,883

(22) Filed: Dec. 30, 2004

(65) Prior Publication Data
US 2005/0142501 A1  Jun. 30, 2005

(30) Foreign Application Priority Data
Dec. 31, 2003  (KR) ............... 10-2003-0101200

(51) Int. Cl.
*G03F 7/00* (2006.01)
(52) U.S. Cl. ............ 430/5; 430/394; 430/311; 430/322
(58) Field of Classification Search ............ 430/5, 430/394, 322, 311
See application file for complete search history.

(56) References Cited

U.S. PATENT DOCUMENTS 5,424,154 A * 6/1995 Borodovsky ............ 430/5
5,571,641 A   11/1996 Bae

FOREIGN PATENT DOCUMENTS

KR   1020010047253 A   6/2001

* cited by examiner

*Primary Examiner*—Mark F. Huff
*Assistant Examiner*—Caleen O Sullivan
(74) *Attorney, Agent, or Firm*—Andrew D. Fortney

(57) ABSTRACT

A method of forming an isolated line on a wafer is disclosed. The disclosed method comprises preparing a first mask comprising an isolated line pattern and dummy patterns, the dummy patterns being positioned on either side of the isolated line pattern; forming an isolated line pattern and dummy patterns on a wafer by performing a first exposure process using the first mask; preparing a second mask comprising a second pattern, the second pattern being positioned so as to completely cover the isolated line pattern on the wafer; and removing the dummy patterns on the wafer by performing a second exposure process using the second mask.

9 Claims, 2 Drawing Sheets

Isolated line pattern    Dense line pattern

METHOD OF FORMING AN ISOLATED LINE PATTERN USING PHOTOLITHOGRAPHY

FIELD OF THE INVENTION

The present invention relates to a photolithography process and, more particularly, to a method of forming an isolated line pattern using a photolithography process of a dual exposure.

BACKGROUND

In a conventional photolithography process, when dense lines and an isolated line are formed on a wafer, the depth of focus (DOF) margin of the dense lines provides a resolution 1.5 times higher than that of the isolated line. Generally, DOF is determined by checking the focus variation within ±10% from a target when the focus of an exposure apparatus varies. Particularly, it is very important to secure the DOF margin of an isolated line in forming gates of a logic device which requires many isolated lines.

Korean Patent Publication Number 2001-0047253, Hynix Semiconductor Inc., describes a photolithography using a double exposure to accurately pattern the hole-pattern of high density. In the described method, a mask is arranged to open the regions corresponding to the (1, 3, 5, . . . , n-1)th or the (2, 4, 6, . . . , n)th hole-patterns in the hole-regions in a direction in which the distance between the hole-patterns is shorter than that of the other direction. Here, the mask is fixed on the first position to transfer a wafer. The mask is shifted by the distance between the hole-patterns in a direction in which the distance between the hole-patterns is shorter than that of the other direction. Therefore, the mask is fixed on the second position to transfer the wafer.

However, such a conventional photolithography process has a problem that an isolated line pattern cannot secure a DOF margin although it is equal to dense lines in size.

SUMMARY OF THE INVENTION

Accordingly, the present invention is directed to a photolithography process that substantially obviates one or more problems due to limitations and disadvantages of the related art.

An object of the present invention is to provide a method of forming an isolated line pattern by using a dual exposure. To achieve these objects and other advantages and in accordance with the purpose of the invention, as embodied and broadly described herein, the present invention provides a method of forming an isolated pattern comprising: preparing a first mask comprising an isolated line pattern and dummy patterns, the dummy patterns being positioned on either side of the isolated line pattern; forming an isolated line pattern and dummy patterns on a wafer by performing a first exposure process using the first mask; preparing a second mask comprising a second pattern, the second pattern being positioned so as to completely cover the isolated line pattern on the wafer; and removing the dummy patterns on the wafer by performing a second exposure process using the second mask.

It is to be understood that both the foregoing general description and the following detailed description of the present invention are exemplary and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Reference will now be made in detail to the preferred embodiments of the present invention, examples of which are illustrated in the accompanying drawings.

Figure 1:
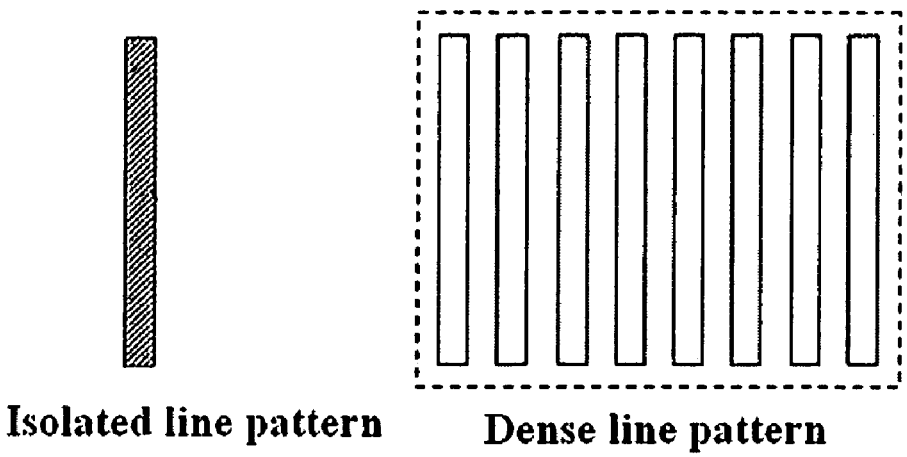
FIG. 1 illustrates examples of an isolated line pattern and a dense line pattern.

FIG. 1 illustrates an isolated line pattern and a dense line pattern 110. As described above, the isolated line pattern is not easily patterned because it cannot secure a DOF margin.

Figure 2:
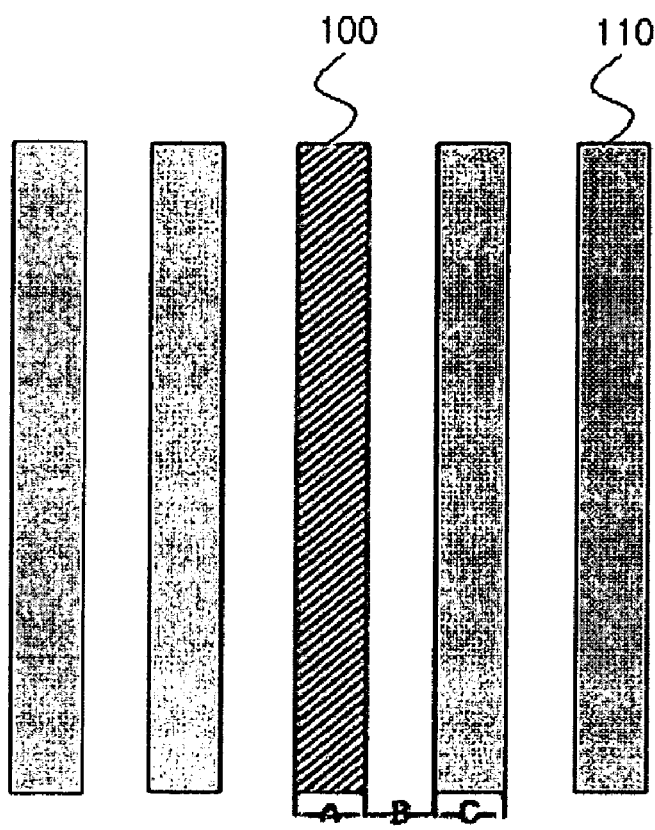
FIG. 2 illustrates an example of a first mask constructed in accordance with the teachings of the present invention.

FIG. 2 illustrates an example of a first mask. To form the isolated line of FIG. 1 on a wafer, a first mask comprising an isolated line pattern and dummy patterns is prepared. The isolated line pattern 100 is positioned at a predetermined place. The dummy patterns 110 are positioned on either side of the isolated line pattern 100. The dummy patterns 110 have a predetermined width, respectively. In addition, the dummy patterns 110 are positioned at a predetermined distance from the isolated line pattern 100. In FIG. 2, "A", "B", and "C" represent the width of the isolated line pattern 100, the space between the isolated line pattern 100 and the adjacent dummy pattern 110, and the width of each dummy pattern 110, respectively. The width (C) of each dummy pattern 110 is preferably equal to or less than the width (A) of the isolated line pattern. The space (B) between the isolated line pattern 100 and the adjacent dummy pattern 110 is preferably equal to or lager than the width (B) of the isolated line 100. By performing a first exposure process using the first mask, the isolated line pattern 100 and the dummy patterns 110 are formed on a wafer.

Figure 3:
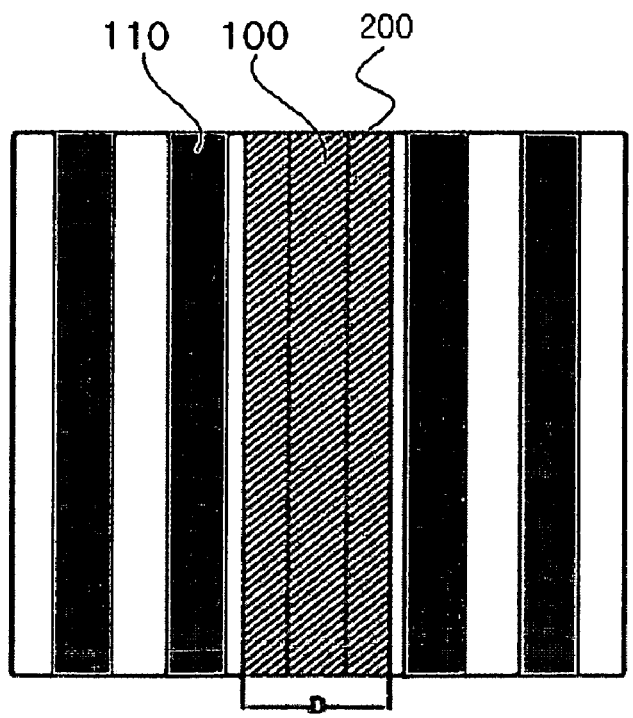
FIG. 3 illustrates an example of a second mask constructed in accordance with the teachings of the present invention.

FIG. 3 illustrates an example of a second mask. The second mask comprises a second pattern 200. The second pattern 200 is placed so as to completely cover the isolated line pattern 100. The second pattern 200 is used to shelter the isolated line pattern 100 on the wafer and at the same time to completely remove the dummy patterns 110 on the wafer during a second exposure process. In FIG. 3, "D" represent the width of the second pattern 200. The width (D) of the second pattern 200 is preferably determined in consideration of the width (A) of the isolated line pattern and the space (B) between the isolated line pattern 100 and the adjacent dummy pattern 110 as follows.

$$\{(A+2B)\times(2/3)\} < D \leq (A+2B)$$

A second exposure process is performed for the wafer on which the isolated line pattern 100 and the dummy patterns 110 are formed by using the second mask. The dummy patterns 110 on the wafer are removed by the exposure to light. The isolated line pattern 100 remains on the wafer because it is protected by the second pattern 200.

Figure 4:
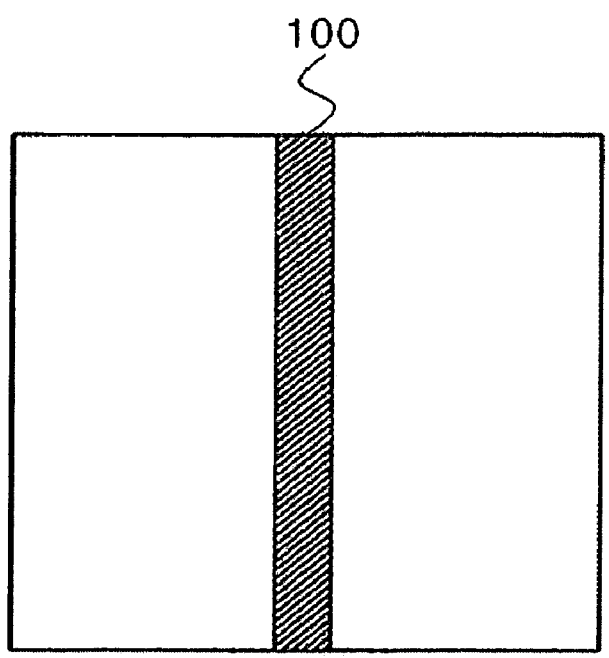
FIG. 4 illustrates an isolated pattern formed by using the first and the second masks constructed in accordance with the teachings of the present invention.

FIG. 4 illustrates an isolated line 100 formed on the wafer after the first and second exposure process.

From the foregoing, persons of ordinary skill in the art will appreciate that, by performing two exposure processes using a first mask and a second mask to improve a DOF, the illustrated example process improves a DOF in a photolithography process, thereby easily controlling a critical dimension (CD) of an isolated line. In addition, the illustrated example process is applicable to a gate formation process requiring precise CD control, thereby enhancing the performance of a device.

From the foregoing, persons of ordinary skill in the art will further appreciate that, by forming the isolated line pattern with a uniform CD using an existing exposure apparatus with a resolution limit, the described method can increase the lifetime of an existing exposure apparatus.

It is noted that this patent claims priority from Korean Patent Application Serial Number 10-2003-0101200, which was filed on Dec. 31, 2003, and is hereby incorporated by reference in entirety.

Although certain example methods, apparatus and articles of manufacture have been described herein, the scope of coverage of this patent is not limited thereto. On the contrary, this patent covers all methods, apparatus and articles of manufacturing fairly falling within the scope of the appended claims either literally or under the doctrine of equivalents.

What is claimed is:

1. A method of forming an isolated line pattern using a photolithography process comprising:

preparing a first mask comprising an isolated line pattern, a first plurality of dummy patterns positioned on a first side of the isolated line pattern, and a second plurality of dummy patterns positioned on an opposite side of the isolated line pattern;

forming the isolated line pattern and the dummy patterns on a wafer by performing a first exposure process using the first mask;

preparing a second mask comprising a second pattern positioned so as to completely cover the isolated line pattern on the wafer and expose the first and second pluralities of dummy patterns and the entire regions between the dummy patterns in each plurality of dummy patterns; and removing the dummy patterns on the wafer by performing a second exposure process using the second mask.

2. A method as defined by claim 1, wherein each of the dummy patterns on the first mask has a width equal to or less than the width of the isolated line pattern.

3. A method as defined by claim 1, wherein the first mask pattern is prepared so that the space between the isolated line pattern and the adjacent dummy pattern on the first mask is equal to or larger than the width of the isolated line pattern.

4. A method as defined by claim 1, wherein the second exposure process using the second mask removes the dummy patterns on the wafer by exposing the dummy patterns to light so that only the isolated line pattern remains on the wafer.

5. The method as defined by claim 1, wherein the second pattern on the second mask has a width (D) determined in consideration of the width (A) of the isolated line pattern and the space (B) between the isolated line pattern and the adjacent dummy pattern as follows:

$$\{(A+2B)\times(2/3)\} < D \leq (A+2B).$$

6. The method as defined by claim 1, wherein the dummy patterns are in a photoresist.

7. The method as defined by claim 1, further comprising preparing the first mask.

8. The method as defined by claim 7, further comprising preparing the second mask.

9. The method as defined by claim 1, further comprising forming a gate after removing the dummy patterns.

* * * * *